US011683918B2

(12) United States Patent
Doo et al.

(10) Patent No.: US 11,683,918 B2
(45) Date of Patent: Jun. 20, 2023

(54) POWER ELECTRONICS MODULE WITH IMPROVED SPACE UTILIZATION AND THERMAL MANAGEMENT CHARACTERISTICS

(71) Applicant: Rivian IP Holdings, LLC, Plymouth, MI (US)

(72) Inventors: Young Doo, La Palma, CA (US); Jason Huang, Fremont, CA (US); Yang Liu, Irvine, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 104 days.

(21) Appl. No.: 17/084,055

(22) Filed: Oct. 29, 2020

(65) Prior Publication Data

US 2022/0142011 A1 May 5, 2022

(51) Int. Cl.
*H05K 7/20* (2006.01)
*B60L 53/302* (2019.01)
*H02J 7/00* (2006.01)

(52) U.S. Cl.
CPC ........ *H05K 7/20909* (2013.01); *B60L 53/302* (2019.02); *H05K 7/2039* (2013.01); *H02J 7/0042* (2013.01)

(58) Field of Classification Search
CPC .... B60L 2210/40; B60L 53/302; B60L 53/20; B60L 53/24; B60L 53/11; H02J 7/0042; H02J 7/0044; H02J 7/0045; H05K 7/20909; H05K 7/209; H05K 7/2039
See application file for complete search history.

(56) References Cited

U.S. PATENT DOCUMENTS

| | | | |
|---|---|---|---|
| 9,148,946 B1 * | 9/2015 | Singh | H05K 7/2089 |
| 2010/0208427 A1 * | 8/2010 | Horiuchi | H05K 7/20927 361/699 |
| 2011/0042038 A1 * | 2/2011 | Herron | H05K 7/20927 165/104.11 |
| 2011/0067841 A1 * | 3/2011 | Doo | H05K 7/20254 165/104.19 |
| 2013/0258602 A1 * | 10/2013 | Hatai | H05K 7/20909 361/729 |
| 2015/0123600 A1 * | 5/2015 | Groat | H02J 7/0042 320/137 |
| 2015/0282383 A1 * | 10/2015 | Singh | H05K 7/20927 361/689 |
| 2019/0320555 A1 * | 10/2019 | Flavin | H05K 7/20409 |
| 2020/0169147 A1 * | 5/2020 | Söhnle | B60K 1/00 |

(Continued)

*Primary Examiner* — Adam B Dravininkas
(74) *Attorney, Agent, or Firm* — Clements Bernard Walker; Christopher L. Bernard (57) ABSTRACT

A power electronics module for an industrial or vehicle battery charger system or the like is provided. The power electronics module utilizes a chassis housing including a heatsink surface and a plurality of sidewalls. A main power section printed circuit board is disposed adjacent to the heatsink surface of the chassis housing a. A low voltage, low power printed circuit board is disposed adjacent to the main power section printed circuit board opposite the heatsink surface of the chassis housing. An alternating current input filter portion printed circuit board including electromagnetics is disposed along one of the plurality of sidewalls of the chassis housing and separated from the low voltage, low power printed circuit board within the chassis housing.

19 Claims, 6 Drawing Sheets

(56) References Cited

U.S. PATENT DOCUMENTS

| | | | |
|---|---|---|---|
| 2020/0273769 A1* | 8/2020 | Xia | H01L 23/045 |
| 2021/0014986 A1* | 1/2021 | Xia | H05K 7/2039 |
| 2021/0153340 A1* | 5/2021 | Lee | H05K 9/0024 |

* cited by examiner

POWER ELECTRONICS MODULE WITH IMPROVED SPACE UTILIZATION AND THERMAL MANAGEMENT CHARACTERISTICS

TECHNICAL FIELD

The present disclosure relates generally to the industrial charging and automotive fields. More particularly, the present disclosure relates to a power electronics module (PEM), such as a PEM used in a charger for an electric vehicle (EV) or a hybrid electric vehicle (HEV), with improved space utilization and thermal management characteristics.

BACKGROUND

Conventionally, PEMs used in power electronics cabinets (PECs) for high power charger applications related to EVs and HEVs and the like consist of a housing in which a plurality of printed circuit boards (PCBs), cooling fans, and other components are disposed. These PCBs include high voltage, high power PCBs, some of which may include electromagnetics, that get very hot, and low voltage, low power PCBs that do not get as hot, but which may be affected by electromagnetic interference (EMI) from the electromagnetics. The PCBs are typically arranged in the housing in an integral or simple side-by-side configuration, leading to space and thermal management challenges with respect to the housing, as well as EMI problems.

Although the present background is provided by way of illustrative environmental context, it will be readily apparent to those of ordinary skill in the art that the concepts and principles of the present disclosure may be implemented in other environmental contexts as well, including those outside of the industrial charging and automotive fields.

SUMMARY

In the PEM of the present disclosure, the hot alternating current (AC) input filter portion (i.e., the electromagnetics) of the high voltage, high power PCB is separated from the main power section of the high voltage, high power PCB and mounted vertically on a sidewall of the associated housing. The main power section of the high voltage, high power PCB is disposed along the bottom of the housing, adjacent to the lower chassis heatsink, where it is most effectively cooled. The low voltage, low power PCB is disposed above the main power section of the high voltage, high power PCB, opposite the lower chassis heatsink. This arrangement minimizes PEM space utilization, optimizes cooling of the high voltage, high power PCB by the lower chassis heatsink, and isolates the low voltage, low power PCB from EMI from the AC input filter portion.

Further, the magnetic components are enclosed within one or more injection molded thermally conductive plastic enclosures with molded pin fins on the bottom thereof that are configured to enhance heat transfer to or through the lower chassis heatsink of the housing. In the case that the molded pin fins protrude through the lower chassis heatsink, the plastic enclosure(s) directly engage the lower chassis heatsink and the molded pins directly interface the coolant in the conduits running adjacent to the lower chassis heatsink, outside of or integrated with the housing. Here, it should be noted that the lower chassis heatsink could be replaced or supplemented by an upper chassis heatsink and the principles applied equally.

Finally, the conduits may be incorporated into the volume of the lower chassis heatsink and the housing itself, with fin or pin structures disposed in portions of the coolant flow to enhance heat transfer from the lower chassis heatsink to the coolant flow via increased heat transfer surface area. Here, a meandering conduit path created using "switchbacks" or the fin structures may be collocated with the adjacent high voltage, high power switching and electromagnetic components within the housing to slow down the coolant flow in areas where more cooling is desired, while the pin structures, resulting in a lower coolant flow pressure drop than the meandering conduit path, may be used in areas where thermal management issues are more mild. This integrated lower chassis heatsink may be manufactured from a die cast metal or the like, creating a simple, low cost, integrated structure. The fin or pin structures integrated into the lower chassis heatsink itself may be used in conjunction with the molded pins of the magnetic component enclosures, mentioned above. Again, here, it should be noted that the lower chassis heatsink could be replaced or supplemented by the upper chassis heatsink and the principles applied equally.

In one illustrative embodiment, the present disclosure provides a power electronics module for an industrial or vehicle battery charger system or the like, including: a chassis housing including a heatsink surface and a plurality of sidewalls; a main power section printed circuit board disposed adjacent to the heatsink surface of the chassis housing; a low voltage, low power printed circuit board disposed adjacent to the main power section printed circuit board opposite the heatsink surface of the chassis housing; and an alternating current input filter portion printed circuit board including electromagnetics disposed along one of the plurality of sidewalls of the chassis housing and separated from the low voltage, low power printed circuit board within the chassis housing.

In another illustrative embodiment, the present disclosure provides a power electronics module for an industrial or vehicle battery charger system or the like, including: a chassis housing including a heatsink surface; an electromagnetic component disposed adjacent to the heatsink surface of the chassis housing; and a thermally conductive plastic enclosure disposed partially or wholly about the electromagnetic component; wherein a bottom surface of the thermally conductive plastic enclosure includes a plurality of protruding fin or pin structures that are adapted to protrude through a port manufactured into or through the heatsink surface of the chassis housing and into a cooling fluid channel formed within or disposed adjacent to the heatsink surface of the chassis housing.

In a further illustrative embodiment, the present disclosure provides a power electronics module chassis housing for an industrial or vehicle battery charger system or the like, including: a heatsink surface including an interior heatsink surface and an exterior heatsink surface; and a plurality of wall structures disposed between the interior heatsink surface and the exterior heatsink surface defining a sealed cooling fluid channel between an inlet port for receiving a cooling fluid into the cooling fluid channel and an outlet port for delivering the cooling fluid from the cooling fluid channel. The power electronics module chassis housing further includes a plurality of fin and/or pin structures formed within the cooling fluid channel between the interior heatsink surface and the exterior heatsink surface adapted to interrupt a flow of the cooling fluid within the cooling fluid channel between the input port and the output port.

BRIEF DESCRIPTION OF THE DRAWINGS

The present disclosure is illustrated and described herein with reference to the various drawings, in which like assembly components/method steps are denoted by like reference numbers, as appropriate, and in which.

DETAILED DESCRIPTION OF ILLUSTRATIVE EMBODIMENTS

Again, PEMs used in PECs for high power charger applications related to EVs and HEVs and the like consist of a housing in which a plurality of PCBs, cooling fans, and other components are disposed. These PCBs include high voltage, high power PCBs, some of which may include electromagnetics, that get very hot, and low voltage, low power PCBs that do not get as hot, but which may be affected by EMI from the electromagnetics. The PCBs are typically arranged in the housing in an integral or simple side-by-side configuration, leading to space and thermal management challenges with respect to the housing, as well as EMI problems. This is disadvantageous, as it is desirable that fast, high power (300 kW plus) direct current (DC) chargers are small and have a high power density. Multiple PEMs may be arranged in a PEC in such a charger application.

Further, within the PEM, magnetic components are the primary heat generators and are typically encapsulated in a metal case with a potting material, and then assembled onto a lower chassis heatsink with a thermal interface material, such as a gap pad or grease. Such packaging is undesirably large and has a high mass due to the required electromagnetic isolation within the metal case, and thermal isolation is undesirably inefficient, with undesirably high thermal resistance due to intervening structures disposed between the metal case and the lower chassis heatsink. In addition, the resulting cost is undesirably high.

Finally, the lower chassis heatsink of the housing may be fluid cooled, using a gas or liquid, via a series of conduits running adjacent to the lower chassis heatsink, outside of the housing. The use of separate components again results in space and thermal management problems, with insufficient thermal coupling, with respect to the combined housing-thermal management system.

Figure 1:
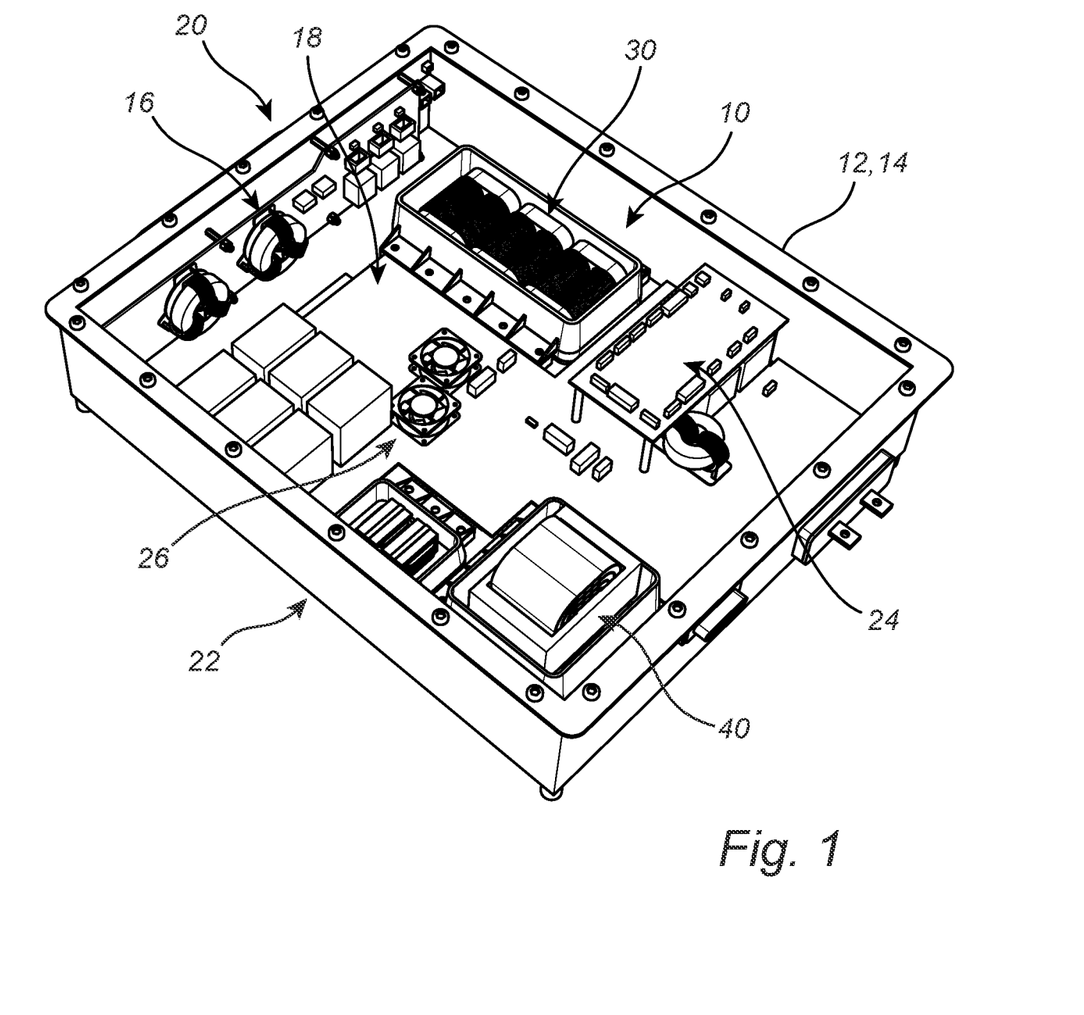
FIG. 1 is a perspective view of one illustrative embodiment of the PEM of the present disclosure, highlighting the relative placement of the associated internal components to minimize space utilization, enhance thermal management, and maximize EMI isolation.

FIG. 1 is a perspective view of one illustrative embodiment of the PEM assembly 10 and PEM enclosure 12 of the present disclosure, highlighting the relative placement of the associated internal components to minimize space utilization, enhance thermal management, and maximize EMI isolation. As discussed above, multiple such PEM assemblies 10 and PEM enclosures 12 may be disposed in a PEC in an industrial or vehicle charger application, for example. In the PEM 10 and enclosure 12 of the present disclosure, the hot AC input filter portion 16 (i.e., the electromagnetics) of the former high voltage, high power PCB is separated from the main power section 18 of the former high voltage, high power PCB and mounted vertically on/parallel to a sidewall 20 of the housing 14 of the enclosure 12. The main power section 18 of the former high voltage, high power PCB is disposed along/parallel to the bottom of the enclosure 12, adjacent to the lower chassis heatsink 22. The AC input filter portion 16 still consists of a PCB, with the hot electromagnetics, as does the main power section 18, but these components are now separated and arranged as provided. The low voltage, low power PCB 24 is disposed above the main power section 18 of the former high voltage, high power PCB, opposite the lower chassis heatsink 22 in a "second story" or "stacked" configuration. This arrangement minimizes PEM space utilization, optimizes cooling of the former high voltage, high power PCB by the lower chassis heatsink 22, and isolates the low voltage, low power PCB 24 from EMI from the AC input filter portion 16. As is conventional, one or more cooling fans 26 are disposed on, through, or otherwise adjacent to the main power section 18 of the former high voltage, high power PCB within the housing 14 and circulate air to all of the PEM components.

In a fast, high power (300 kW plus) DC charger, for example, which is preferably small and has a high power density, the electromagnetics of the AC input filter portion 16 get hot and generate EMI, which may generate noise in the low voltage, low power PCB 24. Thus, these components are now physically separated. The main power section 18, which typically consists of an AC-DC converter and a DC-DC boost, also gets hot and is now disposed directly adjacent to the lower chassis heatsink 22 and in close proximity to the one or more cooling fans 26. As described in greater detail below, this lower chassis heatsink 22 is now fluid cooled in an integrated manner. Because the low voltage, low power PCB 24, which typically consists of processors and connectors, does not generate as much heat relative to the other components, it does not need as much cooling, and may be separated from the lower chassis heatsink 22, thereby allowing it to be "stacked" on top of the main power section 18 opposite the lower chassis heatsink 22, thereby saving space within the housing 14. In this manner, cooling along the z-axis may be concentrated at the bottom of the housing 14, where the lower chassis heatsink 22 is located.

It will be readily apparent to those of ordinary skill in the art that "bottom" and "top," and "lower" and "upper," can be swapped here, and that the AC input filter portion 16 may be disposed on any sidewall 20 of the housing 14 of the enclosure 12, provided that separation from the low voltage, low power PCB 24 is maximized for EMI isolation purposes.

In general, portions of the housing 14 may be manufactured from a high thermally conductive metal, like casted aluminum. In addition to the AC input filter portion 16, the main power section PCB 18, the low voltage, low power PCB 24, and the one or more cooling fans 26, other components making up the PEM 10 include, but are not limited to, current sensors, relays, power modules, and busbars. Also included in the PEM 10 are any number of electromagnetic components 30,40, which are dealt with in greater detail below.

Figure 2:
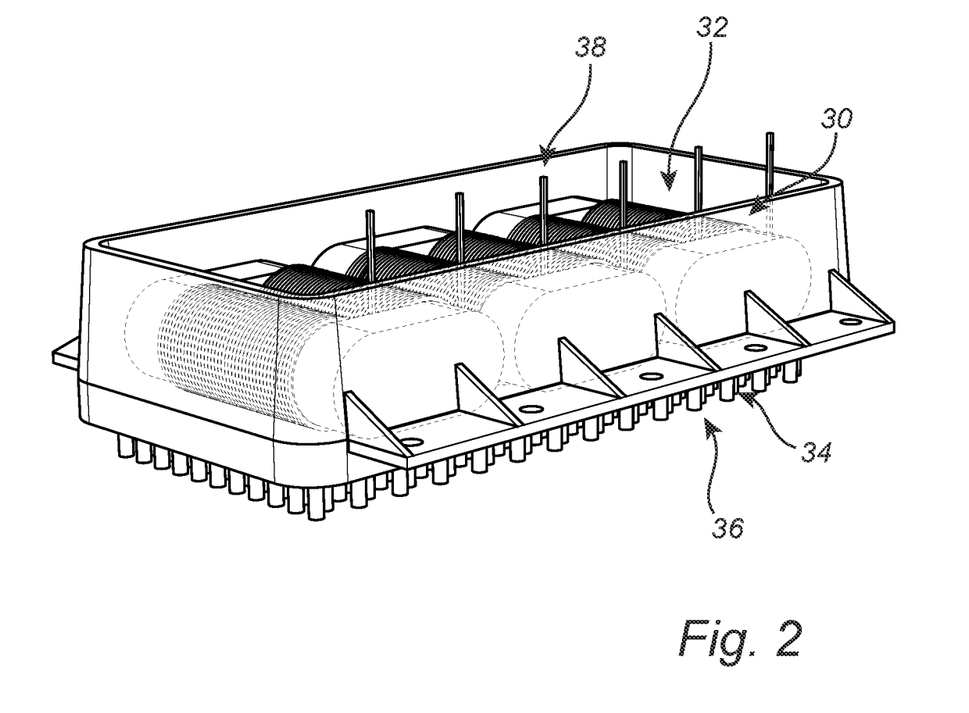
FIG. 2 is a perspective view of a first electromagnetic component of the PEM of FIG. 1 enclosed in a thermally conductive plastic enclosure in accordance with the present disclosure.

FIG. 2 is a perspective view of a first electromagnetic component 30 of the PEM 10 of FIG. 1 enclosed in a thermally conductive plastic enclosure 32 in accordance with the present disclosure. Here, the first electromagnetic component 30 is a power factor correction (PFC) inductor, although it may be any suitable electromagnetic component. The thermally conductive plastic enclosure 32 is injection molded or otherwise disposed wholly (or partially) about the first electromagnetic component 30. The thermally conductive plastic material utilized may be a unique plastic blend with a high thermal conductivity and typically has a thickness of about 2-3 mm, and serves to thermally and electromagnetically isolate the other components of the PEM 10 from the first electromagnetic component 30. As illustrated, the bottom surface 34 of the thermally conductive plastic enclosure 32 includes a plurality of fins, pins, or like structures 36 that increase the surface area available for thermal transmission to a surrounding cooling fluid, whether a gas or a liquid, without resulting excessively interrupting the cooling fluid flow. These fins or pins 36 may be injection molded, additively manufactured, or otherwise formed with the remainder of the thermally conductive plastic enclosure 32. Preferably, the fins or pins 36 have a length such that they protrude partially or wholly through the lower chassis heatsink 22 (FIG. 1) of the enclosure 12 (FIG. 1) and into the cooling fluid flow. Also illustrated in FIG. 2 are the various electrical contacts 38 protruding through the thermally conductive plastic enclosure 32. The thermally conductive plastic enclosure 32 may include any number and configuration of ports and fin or pin structures on other surfaces within the enclosure 12 that enhance thermal coupling with the surrounding cooling air flow generated by the one or more cooling fans 26 (FIG. 1).

Figure 3:
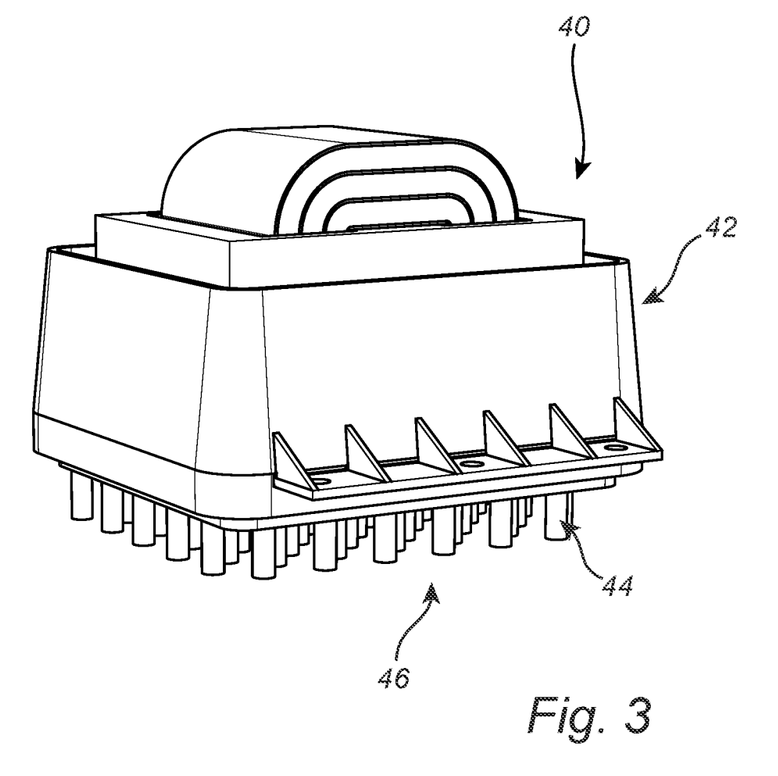
FIG. 3 is a perspective view of a second electromagnetic component of the PEM of FIG. 1 enclosed in a thermally conductive plastic enclosure in accordance with the present disclosure.

FIG. 3 is a perspective view of a second electromagnetic component 40 of the PEM 10 of FIG. 1 enclosed in a thermally conductive plastic enclosure 42 in accordance with the present disclosure. Here, the second electromagnetic component 40 is a high power, high frequency transformer, although it may be any suitable electromagnetic component. The thermally conductive plastic enclosure 42 is again injection molded or otherwise disposed partially (or wholly) about the second electromagnetic component 40. The thermally conductive plastic material utilized may be a unique plastic blend with a high thermal conductivity and typically has a thickness of about 2-3 mm, and serves to thermally and electromagnetically isolate the other components of the PEM 10 from the second electromagnetic component 40. As illustrated, the bottom surface 44 of the thermally conductive plastic enclosure 42 includes a plurality of fins, pins, or like structures 46 that increase the surface area available for thermal transmission to a surrounding cooling fluid, whether a gas or a liquid, without resulting excessively interrupting the cooling fluid flow. These fins or pins 46 may be injection molded, additively manufactured, or otherwise formed with the remainder of the thermally conductive plastic enclosure 42. Preferably, the fins or pins 46 again have a length such that they protrude partially or wholly through the lower chassis heatsink 22 (FIG. 1) of the enclosure 12 (FIG. 1) and into the cooling fluid flow. The thermally conductive plastic enclosure 42 may include any number and configuration of ports and fin or pin structures on other surfaces within the enclosure 12 that enhance thermal coupling with the surrounding cooling air flow generated by the one or more cooling fans 26 (FIG. 1). Here, the thermally conductive plastic enclosure has an open top to expose a portion of the second electromagnetic component 40 to the surrounding environment within the enclosure 12 to help reduce the mass of the enclosure and use less potting material.

Figure 4:
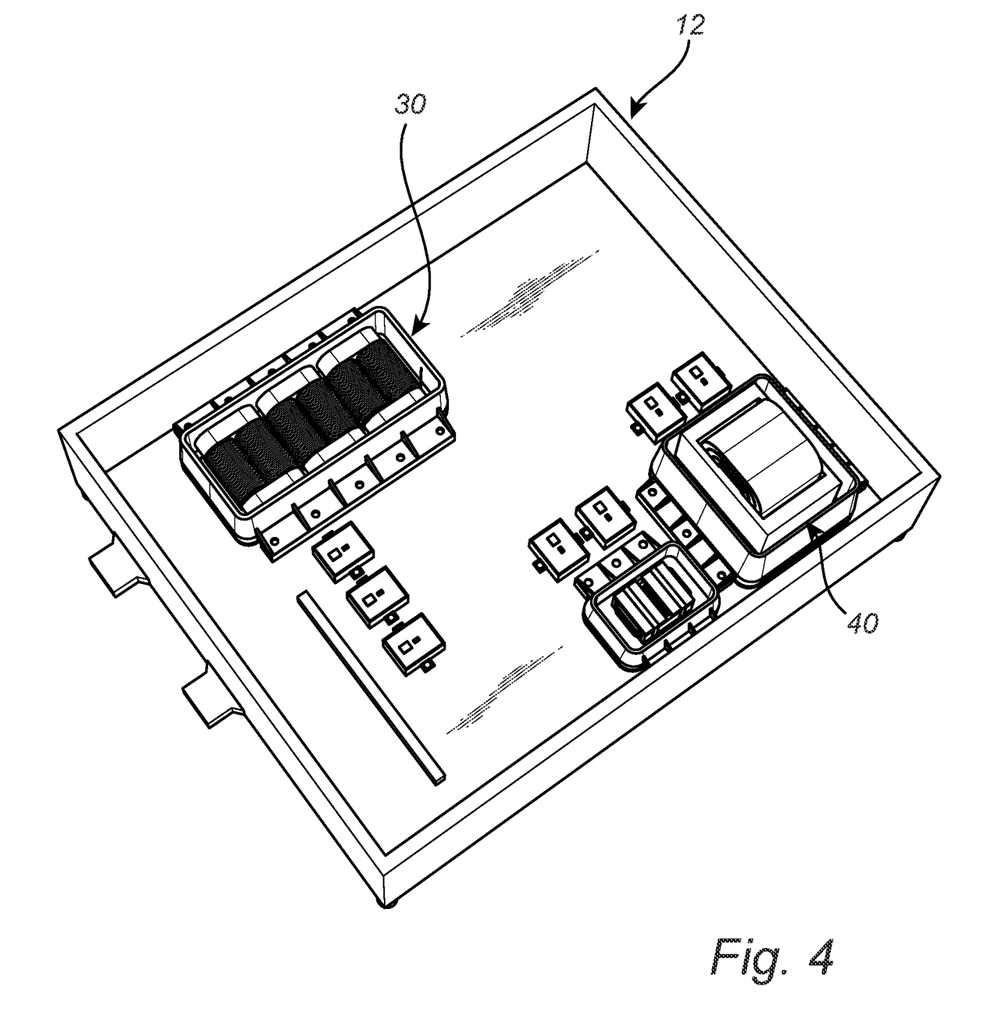
FIG. 4 is a perspective view of the PEM of FIG. 1 with the enclosed electromagnetic components of FIGS. 2 and 3 installed.

FIG. 4 is a perspective view of the enclosure 12 of FIG. 1 with the enclosed electromagnetic components 30,40 of FIGS. 2 and 3 installed. Although the electromagnetic components 30,40 are shown installed in opposite corners of the enclosure 12, it will be readily apparent to those of ordinary skill in the art that other installation locations may be utilized as well, provided that adequate separation is provided with respect to any low voltage, low power PCB 24 (FIG. 1) that may be adversely impacted by EMI from the electromagnetic components 30,40.

Figure 5:
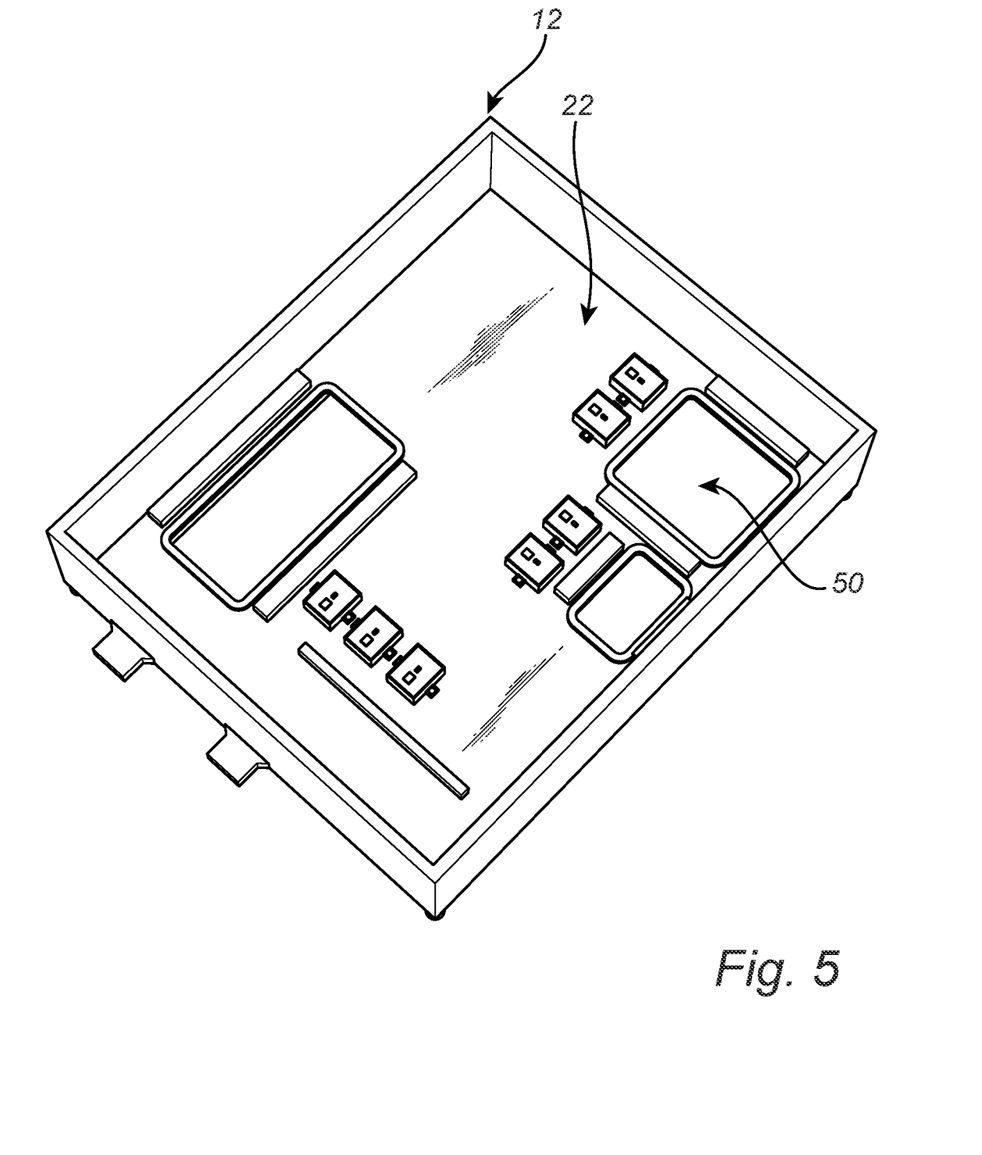
FIG. 5 is a perspective view of the PEM of FIG. 1 without the enclosed electromagnetic components of FIGS. 2 and 3 installed, highlighting the associated thermal management cavities of the lower chassis heatsink.

FIG. 5 is a perspective view of the enclosure 12 of FIG. 1 without the enclosed electromagnetic components 30,40 of FIGS. 2 and 3 installed, highlighting the associated thermal management ports 50, which consist of cavities disposed through the surface on which the enclosed electromagnetic components 30,40 are disposed. Here, the interior surface of the enclosure 12 on which the enclosed electromagnetic components 30,40 are disposed consists of the lower chassis heatsink 22, which draws heat away from the various components of the PEM 10 (FIG. 1) to the cooling fluid flow running through the lower chassis heatsink 22, as described in greater detail below, or adjacent to the lower chassis heatsink 22 in a more conventional embodiment. The thermal management ports 50 are cavities in locations corresponding to the electromagnetic components 30,40 through which the corresponding fins or pins 36 (FIG. 2),46 (FIG. 3) are disposed and introduced into the adjacent cooling fluid flow. Preferably, the thermally conductive plastic enclosures 32 (FIG. 2),42 (FIG. 3) of the electromagnetic components 30,40 are sealingly coupled to the interior surface of the enclosure 12, via a press-in-place seal and/or a sealant, such that cooling fluid is retained in the cooling system of the lower chassis heatsink 22 and does not enter the enclosure 12.

Figure 6:
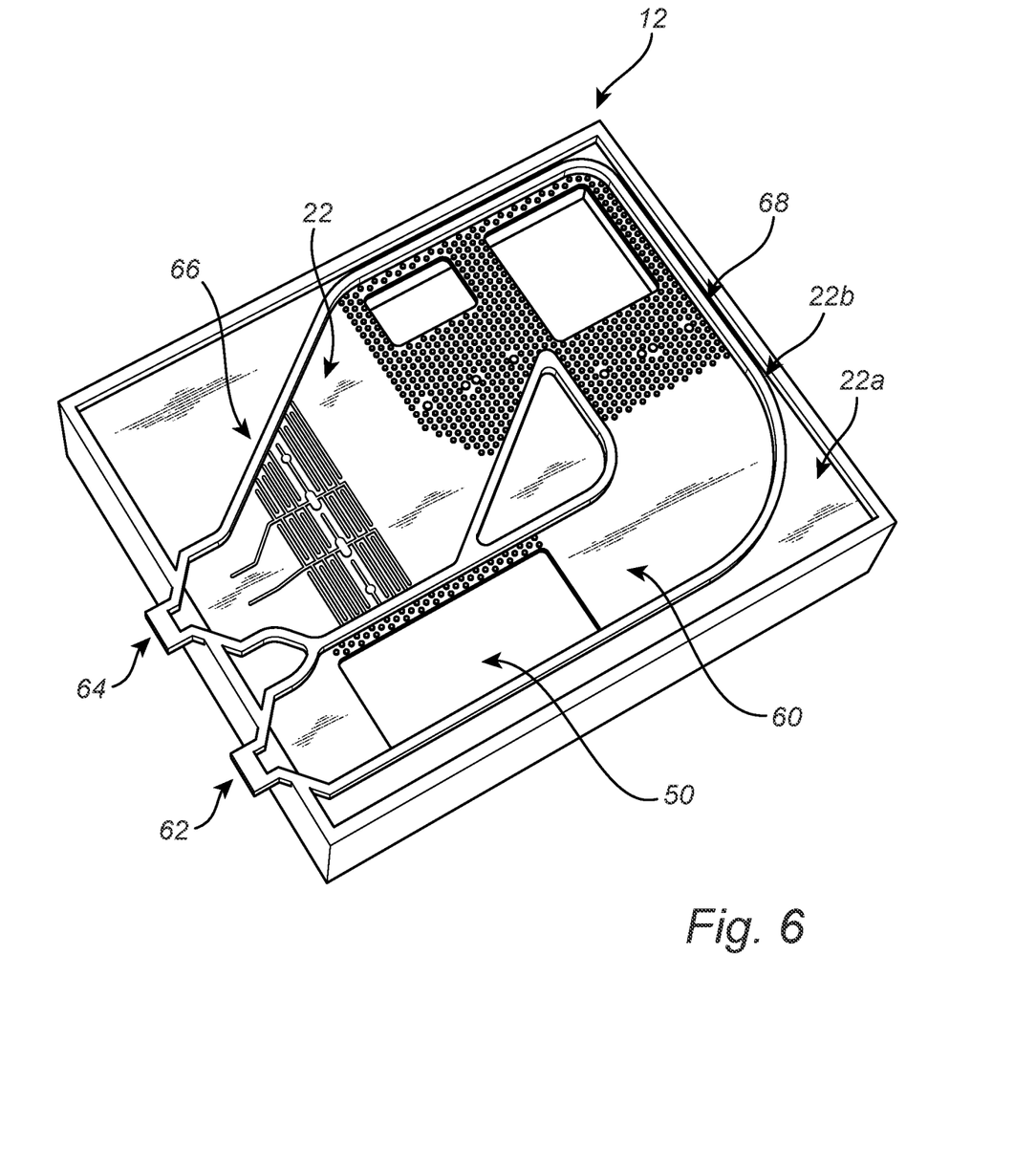
FIG. 6 is a perspective view of the PEM of FIG. 1 without the enclosed electromagnetic components of FIGS. 2 and 3 installed, highlighting the associated thermal management cavities and integrated cooling fluid channel of the lower chassis heatsink.

FIG. 6 is a perspective view of the enclosure 12 of FIG. 1 without the enclosed electromagnetic components 30,40 of FIGS. 2 and 3 installed, highlighting the associated thermal management cavities 50 and an integrated cooling fluid channel 60. Again, the interior surface of the enclosure 12 consists of the lower chassis heatsink 22, which draws heat away from the various components of the PEM 10 (FIG. 1) to the cooling fluid flow running through the lower chassis heatsink 22, as described here, or adjacent to the lower chassis heatsink 22. The thermal management cavities 50 are cavities in locations corresponding to the electromagnetic components 30,40 through which the corresponding fins or pins 36 (FIG. 2),46 (FIG. 3) are disposed and introduced into the adjacent cooling fluid flow. Preferably, the thermally conductive plastic enclosures 32 (FIG. 2),42 (FIG. 3) of the electromagnetic components 30,40 are sealingly coupled to the interior surface of the enclosure 12, via a press-in-place seal and/or a sealant, such that cooling fluid is retained in the cooling system of the lower chassis heatsink 22 and does not enter the enclosure 12 and adversely affect the electronics inside. As illustrated, the interior portion of the lower chassis heatsink 22 itself defines the integrated cooling fluid channel 60, which traverses the various portions of the enclosure 12 that need to be cooled. The cooling fluid channel 60 is configured to circulate cooling fluid, which may consist of a gas or a liquid, such as a 50/50 mix of water and coolant, from an inlet port 62 to an outlet port 64 that are manufactured into the enclosure 12. Here, the cooling fluid channel

60 is illustrated without an associated bottom enclosure surface for clarity. Any suitably shaped cooling fluid circuit may be utilized.

Structurally, the lower chassis heatsink 22 includes an interior heatsink surface 22a and an exterior heatsink surface (again, not illustrated for clarity, but like the interior heatsink surface 22a) and a plurality of wall structures 22b disposed between the interior heatsink surface 22a and the exterior heatsink surface defining the sealed cooling fluid channel 60 between the inlet port 62 for receiving the cooling fluid into the cooling fluid channel 60 and the outlet port 64 for delivering the cooling fluid from the cooling fluid channel 60, thereby forming the cooling fluid circuit through the lower chassis heatsink.

Fin structures 66 or pin structures 68 are disposed in portions of the coolant flow channel 60 to enhance heat transfer from the lower chassis heatsink 22 to the coolant flow via increased heat transfer surface area. Here, a meandering conduit path created using "switchbacks" or the fin structures 66 may be collocated with the adjacent high voltage, high power switching and electromagnetic components within the enclosure 12 to slow down the coolant flow in areas where more cooling is desired, while the pin structures 68, resulting in a lower coolant flow pressure drop than the meandering conduit path, may be used in areas where thermal management issues are more mild. This integrated lower chassis heatsink 22 may be manufactured from a die cast metal or the like, creating a simple, low cost, integrated structure. Typically, the integrated lower chassis heatsink 22 has a thickness of about 3 mm and the fin structures 66 and/or pin structures 68 traverse this distance. The fin structures 66 and/or pin structures 68 structures integrated into the lower chassis heatsink 22 itself may be used in conjunction with the molded pins 36 (FIG. 2),46 (FIG. 3) of the magnetic component enclosures 32 (FIG. 2), 42 (FIG. 3), mentioned above. Again, here, it should be noted that the lower chassis heatsink 22 could be replaced or supplemented by an upper chassis heatsink and the principles applied equally.

Thus, in the PEM of the present disclosure, the hot AC input filter portion (i.e., the electromagnetics) of the high voltage, high power PCB is separated from the main power section of the high voltage, high power PCB and mounted vertically on a sidewall of the enclosure or housing. The main power section of the high voltage, high power PCB is disposed along the bottom of the enclosure or housing, adjacent to the lower chassis heatsink, where it is most effectively cooled. The low voltage, low power PCB is disposed above the main power section of the high voltage, high power PCB, opposite the lower chassis heatsink. This arrangement minimizes PEM space utilization, optimizes cooling of the high voltage, high power PCB by the lower chassis heatsink, and isolates the low voltage, low power PCB from EMI from the AC input filter portion.

Further, the magnetic components are enclosed within one or more injection molded thermally conductive plastic enclosures with molded pins on the bottom thereof that are configured to enhance heat transfer to or through the lower chassis heatsink of the enclosure. In the case that the molded pins protrude through the lower chassis heatsink, the plastic enclosure(s) sealingly engage the lower chassis heatsink and the molded pins directly interface the coolant in the conduits running adjacent to the lower chassis heatsink, outside of or integrated with the enclosure or housing. Here, it should be noted that the lower chassis heatsink could be replaced or supplemented by an upper chassis heatsink and the principles applied equally.

Finally, the conduits may be incorporated into the volume of the lower chassis heatsink and the housing itself, with fin or pin structures disposed in portions of the coolant flow to enhance heat transfer from the lower chassis heatsink to the coolant flow via increased heat transfer surface area. Here, a meandering conduit path created using "switchbacks" or the fin structures may be collocated with the adjacent high voltage, high power switching and electromagnetic components within the housing to slow down the coolant flow in areas where more cooling is desired, while the pin structures, resulting in a lower coolant flow pressure drop than the meandering conduit path, may be used in areas where thermal management issues are more mild. This integrated lower chassis heatsink may be manufactured from a die cast metal or the like, creating a simple, low cost, integrated structure. The fin or pin structures integrated into the lower chassis heatsink itself may be used in conjunction with the molded pins of the magnetic component enclosures, mentioned above. Again, here, it should be noted that the lower chassis heatsink could be replaced or supplemented by the upper chassis heatsink and the principles applied equally.

Although the present disclosure is illustrated and described herein with reference to illustrative embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A power electronics module for an industrial or vehicle battery charger system, comprising:
   a chassis housing comprising a heatsink surface and a plurality of sidewalls;
   a main power section printed circuit board disposed adjacent to the heatsink surface of the chassis housing;
   a low voltage, low power printed circuit board disposed adjacent to the main power section printed circuit board opposite the heatsink surface of the chassis housing; and
   an alternating current input filter portion printed circuit board comprising electromagnetics disposed along one of the plurality of sidewalls of the chassis housing and separated from the low voltage, low power printed circuit board within the chassis housing;
   wherein the main power section printed circuit board and the alternating current input filter portion printed circuit board comprise separate printed circuit boards.

2. The power electronics module of claim 1, further comprising a cooling fan disposed at least partially within the chassis housing adjacent to the main power section printed circuit board.

3. The power electronics module of claim 1, wherein the main power section printed circuit board comprises an alternating current to direct current converter and a direct current to direct current boost.

4. The power electronics module of claim 1, wherein the low voltage, low power printed circuit board comprises a processor and a connector.

5. The power electronics module of claim 1, wherein the alternating current input filter portion printed circuit board is separated from the low voltage, low power printed circuit board within the chassis housing such that the low voltage, low power printed circuit board is isolated from electromagnetic interference from the electromagnetics of the alternating current input filter portion printed circuit board.

6. The power electronics module of claim 1, further comprising:
an electromagnetic component disposed adjacent to the heatsink surface of the chassis housing; and
a thermally conductive plastic enclosure disposed partially or wholly about the electromagnetic component;
wherein a bottom surface of the thermally conductive plastic enclosure comprises a plurality of protruding fin or pin structures that are adapted to protrude through a port manufactured into or through the heatsink surface of the chassis housing and into a cooling fluid channel formed within or disposed adjacent to the heatsink surface of the chassis housing.

7. The power electronics module of claim 6, wherein the thermally conductive plastic enclosure is sealingly coupled to an interior portion of the heatsink surface around a bottom edge of the thermally conductive plastic enclosure.

8. The power electronics module of claim 1, wherein the heatsink surface comprises:
an interior heatsink surface and an exterior heatsink surface; and
a plurality of wall structures disposed between the interior heatsink surface and the exterior heatsink surface defining a sealed cooling fluid channel between an inlet port for receiving a cooling fluid into the cooling fluid channel and an outlet port for delivering the cooling fluid from the cooling fluid channel.

9. The power electronics module of claim 8, wherein the heatsink surface further comprises a plurality of fin structures formed within the cooling fluid channel between the interior heatsink surface and the exterior heatsink surface adapted to interrupt a flow of the cooling fluid within the cooling fluid channel between the input port and the output port.

10. The power electronics module of claim 9, wherein the plurality of fin structures formed within the cooling fluid channel are collocated with one or more of the main power section printed circuit board disposed within the chassis housing and an electromagnetic component disposed within the chassis housing.

11. The power electronics chassis housing of claim 8, wherein the heatsink surface further comprises a plurality of pin structures formed within the cooling fluid channel between the interior heatsink surface and the exterior heatsink surface adapted to interrupt a flow of the cooling fluid within the cooling fluid channel between the input port and the output port.

12. The power electronics module of claim 11, wherein the plurality of fin structures formed within the cooling fluid channel are collocated with one or more of the main power section printed circuit board disposed within the chassis housing and an electromagnetic component disposed within the chassis housing.

13. A power electronics module for an industrial or vehicle battery charger system, comprising:
a chassis housing comprising a heatsink surface;
an electromagnetic component disposed within the chassis housing adjacent to the heatsink surface of the chassis housing; and
a thermally conductive plastic enclosure disposed within the chassis housing partially or wholly about the electromagnetic component;
wherein a bottom surface of the thermally conductive plastic enclosure comprises a plurality of protruding fin or pin structures that are adapted to protrude through a port manufactured into or through the heatsink surface of the chassis housing and into a cooling fluid channel formed within or disposed adjacent to the heatsink surface of the chassis housing.

14. The power electronics module of claim 13, wherein the thermally conductive plastic enclosure is sealingly coupled to an interior portion of the heatsink surface around a bottom edge of the thermally conductive plastic enclosure.

15. The power electronics module of claim 14, wherein the thermally conductive plastic enclosure is sealingly coupled to the interior portion of the heatsink surface around the bottom edge of the thermally conductive plastic enclosure using a sealant.

16. A power electronics module chassis housing for an industrial or vehicle battery charger system, comprising:
a heatsink surface comprising an interior heatsink surface and an exterior heatsink surface;
a plurality of wall structures disposed between the interior heatsink surface and the exterior heatsink surface defining a sealed cooling fluid channel between an inlet port for receiving a cooling fluid into the cooling fluid channel and an outlet port for delivering the cooling fluid from the cooling fluid channel; and
a plurality of pin structures formed within the cooling fluid channel between the interior heatsink surface and the exterior heatsink surface adapted to interrupt a flow of the cooling fluid within the cooling fluid channel between the input port and the output port.

17. The power electronics module chassis housing of claim 16, further comprising a plurality of fin structures formed within the cooling fluid channel between the interior heatsink surface and the exterior heatsink surface adapted to interrupt a flow of the cooling fluid within the cooling fluid channel between the input port and the output port.

18. The power electronics module chassis housing of claim 17, wherein the plurality of fin structures formed within the cooling fluid channel are collocated with a hot high voltage, high power printed circuit board or hot electromagnetic component disposed within the power electronics chassis.

19. The power electronics module chassis housing of claim 16, wherein the plurality of pin structures formed within the cooling fluid channel are collocated with a hot high voltage, high power printed circuit board or hot electromagnetic component disposed within the power electronics chassis.

* * * * *